United States Patent
Wilson et al.

(10) Patent No.: US 7,213,739 B2
(45) Date of Patent: May 8, 2007

(54) UNDERFILL FLUXING CURATIVE

(75) Inventors: Mark Wilson, Cumming, GA (US); James M. Hurley, Atlanta, GA (US)

(73) Assignee: Fry's Metals, Inc., Alpharetta, GA (US)

( * ) Notice: Subject to any disclaimer, the term of this patent is extended or adjusted under 35 U.S.C. 154(b) by 57 days.

(21) Appl. No.: 10/817,138

(22) Filed: Apr. 2, 2004

(65) Prior Publication Data

US 2005/0218195 A1   Oct. 6, 2005

(51) Int. Cl.
*H01L 21/56* (2006.01)
*B23K 31/02* (2006.01)
*B32B 27/38* (2006.01)
*B32B 27/26* (2006.01)
*C08L 63/00* (2006.01)

(52) U.S. Cl. .................. 228/180.22; 428/413; 428/414; 523/429; 523/428

(58) Field of Classification Search ...................... None
See application file for complete search history.

(56) References Cited

U.S. PATENT DOCUMENTS

| | | |
|---|---|---|
| 3,356,645 A | 12/1967 | Warren |
| 3,418,333 A | 12/1968 | Warren |
| 3,746,686 A * | 7/1973 | Marshall et al. ............ 528/114 |
| 5,128,746 A | 7/1992 | Pennisi et al. |
| 5,985,043 A | 11/1999 | Zhou et al. |
| 6,180,696 B1 | 1/2001 | Wong et al. |
| 6,458,472 B1 | 10/2002 | Konarski et al. |
| 6,632,893 B2 | 10/2003 | Konarski et al. |
| 6,660,943 B1 * | 12/2003 | Gotoh et al. ................. 174/260 |
| 6,706,417 B2 | 3/2004 | Konarski et al. |
| 2002/0014703 A1 | 2/2002 | Capote et al. |
| 2002/0089067 A1 | 7/2002 | Crane et al. |
| 2003/0111519 A1 | 6/2003 | Kinney et al. |

* cited by examiner

Primary Examiner—Michael J. Feely
(74) Attorney, Agent, or Firm—Senniger Powers

(57) ABSTRACT

The invention is directed to a fluxing curative for curing an underfill that comprises an epoxy resin and for fluxing a solder during a solder assembly of an electronic component to an electronic device substrate and a method for producing the fluxing curative. Specifically, the fluxing curative comprises a salt that is a reaction product of an imidazole component and a carboxylic acid component having at least 10 carbon atoms per molecule. Additionally, the invention is directed to an underfill solution comprising the fluxing curative and a method of attaching an integrated circuit device using the underfill solution.

25 Claims, 1 Drawing Sheet

UNDERFILL FLUXING CURATIVE

BACKGROUND OF THE INVENTION

1. Field of the Invention

The present invention relates to a fluxing curative for an underfill solution that is used to assemble an electronic package. More particularly, the fluxing curative, during a solder operation, fluxes the solder and/or solder pads and cures the epoxy resin of the underfill solution.

2. Description of Related Technology

Electrical components such as resisters, capacitors, inductors, transistors, integrated circuits, and chip carriers are typically mounted on circuit boards according to one of two configurations. In the first configuration, the components are mounted on one side of the board and leads from the components extend through holes in the board and are soldered on the opposite side of the board. In the second configuration, the components are soldered to the same side of the board upon which they are mounted. These latter devices are said to be "surface-mounted."

Surface mounting of electronic components is a desirable technique in that it may be used to fabricate very small circuit structures and in that it lends itself well to process automation. A type of surface-mounted device referred to as an area array package comprises an integrated circuit having numerous connecting leads attached to pads mounted on the underside of the device. Examples of area array packages include a flip chip, a chip scale package (CSP), and a ball grid array (BGA). In connection with the use of an area array package, either the circuit board or the device is provided with small bumps or balls of solder (hereinafter "bumps" or "solder bumps") positioned in locations which correspond to the pads on the underside of each device and on the surface of the circuit board. The device is mounted by (a) placing it in contact with t he board such that the solder bumps become sandwiched between the pads on the board and the corresponding pads on the device; (b) heating the assembly to a point at which the solder is caused to reflow (i.e., melt); and (c) cooling the assembly. Upon cooling, the solder hardens and affixes the area array device to the board's surface. Tolerances in area array technology tend to be critical because the spacing between individual devices as well as the spacing between the chip and the board is typically very small. For example, spacing of a flip chip from the surface of a board to the bottom of a die is typically between about 15 and about 75 μm and is expected to approach about 10 μm in the near future.

One problem associated with area array technology is that the chips, the solder, and the material forming the circuit board often have significantly different coefficients of thermal expansion. As a result of the differing expansions, the heating of the assembly during use can cause severe stresses. The stresses imposed on the solder interconnects can lead to failures that degrade device performance or incapacitate the device entirely.

In order to minimize thermomechanical fatigue resulting from different thermal expansions, thermoset epoxies have typically been used. Specifically, these epoxies are used as an underfill material that surrounds the periphery of the area array device and occupies the space beneath the chip between the underside of the chip and the board which is not occupied by solder. Such epoxy systems provide a level of protection by forming a physical barrier that resists or reduces the stress on solder interconnects due to different expansions among the components of the device and/or to drop shocks.

Improved underfill materials have been developed in which the epoxy thermoset material is provided with a silica powder filler. By varying the amount of filler material, it is possible to cause the coefficient of thermal expansion of the filled epoxy thermoset to more closely match that of the integrated circuit and printed circuit board substrates. In so doing, relative movement between the underside of the flip chip and the solder connections, resulting from their differing coefficients of thermal expansion, is minimized. Such filled epoxy thermosets therefore reduce the likelihood of device failure resulting from thermomechanical fatigue during operation of the device.

While underfill has solved the thermal mismatch problem for area array devices on printed circuit boards, it has created significant difficulties in the manufacturing process. For example, the underfill must be applied off-line using special equipment. Typically, the underfill is applied to up to three edges of the assembled flip chip and allowed to flow all the way under the chip via capillary action. Once the material has flowed to opposite edges and all air has been displaced from under the chip, additional underfill is dispensed to the outer edges so as to form a fillet making all four edges symmetrical. This improves the reliability and the appearance of the assembly. Next, the assembly is baked in an oven to harden the underfill. This process, which may take up to several hours, is necessary to harden and fully cure the underfill. Thus, although the underfill couples the area array device to the substrate replacing shear stresses with bending stresses, and provides a commercially viable solution, a simpler manufacturing method is desirable.

Recently, attempts have been made to improve and streamline the underfill process. One method that has shown some commercial potential involves dispensing underfill before assembling the area array device to the substrate and making solder connections. This method requires that the underfill allow solder joint formation to occur. Soldering of area array devices to printed circuit boards is generally accomplished by applying flux to the solder bumps on the device or to the pads on the printed circuit board. Thus, the flux must be applied to the bumps before the underfill or the underfill must contain flux or have inherent properties that facilitate solder joint formation. Flux activity is needed to remove the oxidation on the pads for the solder to wet the pad metalization forming acceptable interconnects.

Certain underfills commonly called "dispense first underfills," "pre-applied," "package applied," or "no flow" underfills have been designed with self-contained flux chemistry. Unfortunately, the properties required for a good flux and those required for a good underfill have tended to be incompatible. As such, a compromise of properties has been the result. For example, the best fluxing underfill materials typically require more than an hour to harden or are too reactive and gel prematurely, which results in electrical disconnects. More specifically, premature gellation may result in misalignment between the device and the substrate and/or it may prevent collapse of the solder bumps, either of which prevents the formation of an adequate solder connection and may render the electronic assembly defective or inoperable.

In an attempt to alleviate some of the foregoing problems, fluxing underfill compositions containing anhydride compounds as a curing agent have been developed. Advantageously, underfills utilizing an anhydride curing agent tend to have a cure profile that is compatible with conventional solder reflow operations. However, the use of anhydride compounds has resulted in other drawbacks to no-flow solder systems. For example, anhydride compounds tend to produce residues that are corrosive to the metal pads and/or the solder alloy, which may result in the electronic assembly becoming inoperable. Additionally, anhydride compounds tend to form voids that degrade the strength and adhesion of the underfill especially at the high reflow temperatures needed for lead free solder applications. Still further, anhydride compounds tend to take part in the bonding or crosslinking of epoxy molecules with ester linkages, which are susceptible to degradation when exposed to moisture. This degradation of the epoxy decreases the reliability performance of the underfill and may result in failure of the electronic assembly.

SUMMARY OF THE INVENTION

Briefly, therefore, the present invention is directed to a fluxing curative for curing an underfill that comprises an epoxy resin and for fluxing a solder during a solder assembly of an electronic component to an electronic device substrate. The fluxing curative comprises a salt that is a reaction product of an imidazole component and a carboxylic acid component having at least 10 carbon atoms per molecule.

The present invention is also directed to a method of preparing a salt that is used for curing an underfill that comprises an epoxy resin component and for fluxing a solder during a solder assembly of an electronic component to an electronic device substrate. The method comprises mixing an imidazole component with a carboxylic acid component having at least 10 carbon atoms per molecule at a temperature and for a duration sufficient to form the salt.

Additionally, the present invention is directed to an underfill solution for application between an electronic component and an electronic device substrate to assist in solder assembly of the electronic component to the electronic device substrate and to provide mechanical shock resistance and thermal cycling resistance. The underfill solution comprises an epoxy resin component and a fluxing curative for curing the epoxy resin component and for fluxing a solder during the solder assembly. The fluxing curative comprises a salt that is a reaction product of an imidazole component and a carboxylic acid component having at least 10 carbon atoms per molecule.

The present invention is further directed to a method for attaching an integrated circuit device having at least one solder bump on a surface thereof to a circuit board having at least one metal pad on a surface thereof by soldering. The method comprises applying an underfill solution to the surface of the circuit board such that the underfill solution is in contact with the at least one metal pad, wherein the underfill solution comprises an epoxy resin component and a fluxing curative for curing the epoxy resin component and for fluxing the at least one solder bump. The fluxing curative comprises a salt that is a reaction product of an imidazole component and a carboxylic acid component having at least 10 carbon atoms per molecule. Additionally, the method comprises placing the integrated circuit device onto the circuit board to yield a circuit board with the integrated circuit device placed thereon and heating the circuit board with the integrated circuit device placed thereon to a reflow temperature to melt and flux the at least one solder bump, to flow the underfill, and to cure the epoxy resin thereby yielding a circuit board having the integrated circuit device attached thereto with a solder connection and a cured underfill.

The foregoing and other features and advantages of the present invention will become more apparent from the following description and accompanying drawing.

DETAILED DESCRIPTION OF THE INVENTION

Figure 1:
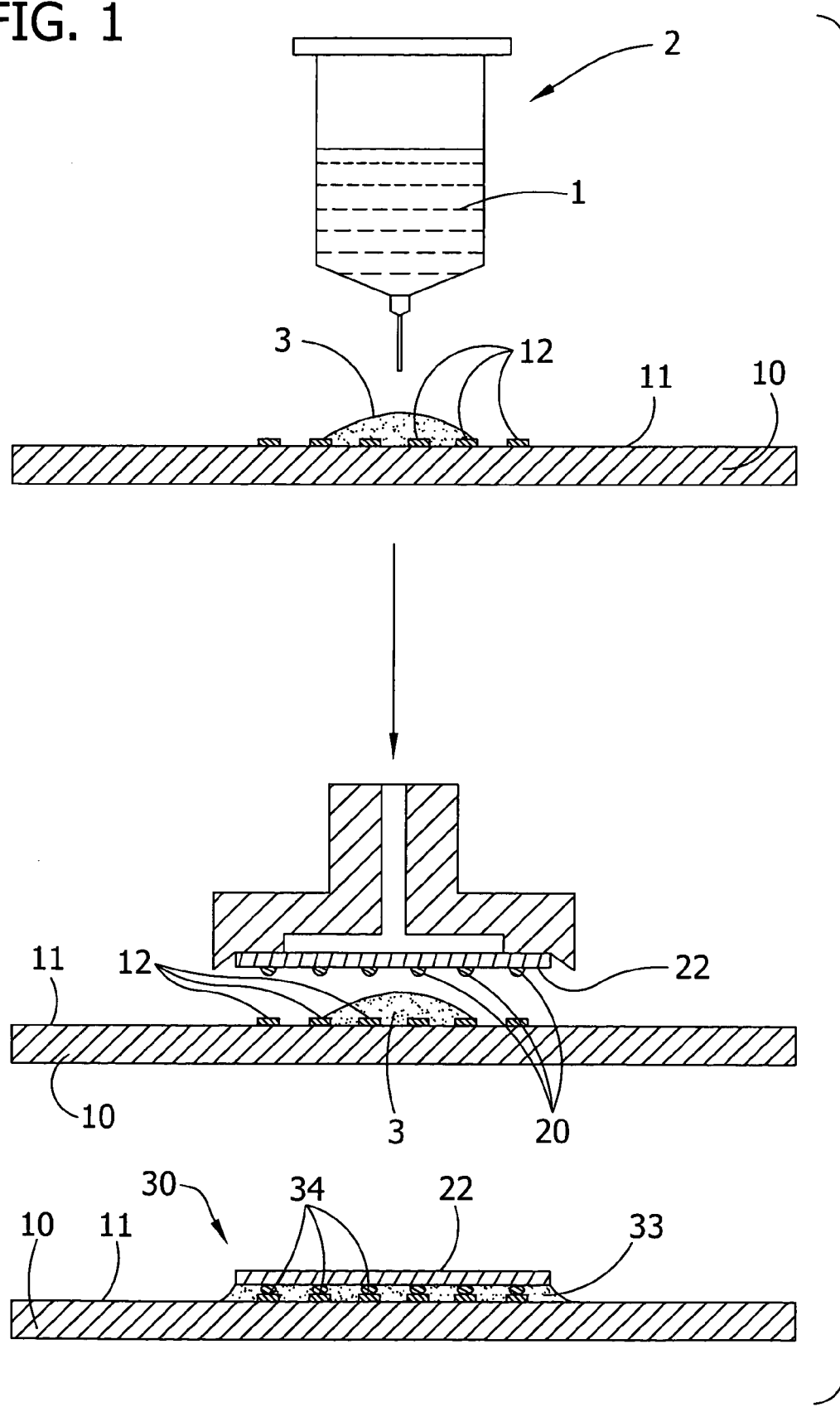
FIG. 1 is a schematic representation of a no flow underfill assembly process.

The present invention is generally directed to joining any appropriate electronic component to any appropriate electronic device substrate (e.g., printed circuit board). In accordance with the present invention, any appropriate electronic component may, for example, comprise one or more of the following: an integrated circuit device (e.g., a flip chip), a resistor, a capacitor, an inductor, a transistor, or an area array device. It is to be noted that hereinafter this disclosure will be directed primarily to the joining of an integrated circuit device to a printed circuit board. This, however, is not to be interpreted as limiting the scope of the invention.

Specifically, the present invention is directed to an underfill comprising an epoxy component to control stress between an electrical component and a printed circuit board and improve the reliability of the device. The underfill is formed in part by depositing onto an electrical component and/or a printed circuit board an underfill solution comprising the epoxy component and a fluxing curative for curing the epoxy and fluxing the solder and metal pads being joined with the solder.

A. Substrate Materials

The invention is applicable to any electronic device substrate to which electronic components are attached by soldering. Appropriate substrate materials for a printed circuit board and/or an integrated circuit device include, for example, high-pressure laminates (i.e., layers of fibrous materials bonded together under heat and pressure with a thermosetting resin). In general, a laminate layer comprises an electrical-grade paper bonded with phenolic or epoxy resin or a continuous-filament glass cloth bonded with an epoxy-resin system. Specific examples of laminate layers include the following: XXXPC, which is an electrical paper impregnated with phenolic resin; FR-2, which is similar to XXXPC with a flame retardant property; FR-3, which is a self-extinguishing laminate of electrical paper and epoxy resin; G-10, which is a laminate of glass cloth sheets and epoxy resin; FR-4, which is a self-extinguishing laminate similar to G-10; G-11, which is a glass cloth and epoxy mixture; and FR-5, which is a flame-resistant version of G-11. In one embodiment of the present invention the organic circuit board material is an FR-4 laminate layer that is placed on top of, and in intimate contact with, the passive component pattern and the two are laminated together. In addition to laminated organic materials, the substrate to which the integrated circuit is bonded may comprise, for example, a semiconductor material such as silicon or gallium arsenide, or an inorganic oxide such as alumina, titania, or zirconia.

B. Solder Alloys

The selection of the solder for joining an electronic component such as an the integrated circuit device and an electronic device substrate such as a printed circuit board depends upon several factors. For example, the solder should be compatible with the metal or metals used to form the leads of the integrated circuit device and the printed circuit board (i.e., upon removal of oxides from said metals by the fluxing agent, the solder wets the leads during reflow to form an electrically conductive bond). Additionally, the selection of the solder may depend upon environmental and/or worker safety concerns. For example, there is an ever increasing demand for lead-free solders. Still further, the solder alloy preferably melts at a sufficiently low temperature so that there is no degradation of the integrated circuit device or the printed circuit board during reflow. Also, the solder preferably melts at a temperature at which the underfill does not degrade. For example, it is typically desirable for a solder to melt at a temperature that is less than about 300° C. Preferably, the solder melts at a temperature between about 180° C. and about 260° C. More preferably, the solder melts at a temperature between about 220° C. and about 260° C. Additionally, the solder alloy is preferably stable (e.g., it does not evaporate) at a temperature that is between about 10 and about 40° C. above the melt temperature because typical reflow operations result in the solder alloy attaining such temperatures. For example, when reflowing a solder alloy having a relatively high melting temperature such as between about 210° C. and about 240° C., the reflow temperature is typically between about 220° C. and about 280° C. Similarly, when reflowing a solder alloy having a relatively low melting temperature such as between about 160° C. and about 190° C., a relatively low reflow temperature that is between about 170° C. and about 230° C. is typical.

In view of the foregoing, the thermosetting fluxing underfill of the present invention may be used with any conventional leaded solders (e.g., $Sn_{63}Pb_{37}$ and $Sn_{62}Pb_{36}Ag_2$). Additionally, it is particularly useful with solder alloys that are substantially free of lead, which are commonly referred to as Pb-free solder alloys and typically contain less than about 0.3 wt % of lead. Pb-free solder alloys tend to have higher liquidus temperatures and/or require longer reflow durations than lead-containing solder alloys. Exemplary Pb-free solder alloys include: $Au_{80}Sn_{20}$, $Sn_{96.2}Ag_{2.5}Cu_{0.8}Sb_{0.5}$, $Sn_{65}Ag_{25}Sb_{10}$, $Sn_{96.5}Ag_{3.5}$, $Sn_{95.5}Ag_{3.8}Cu_{0.7}$, $Sn_{96.5}Ag_3Cu_{0.5}$, $Sn_{95.5}Ag_4Cu_{0.5}$, $Sn_{93.6}Ag_{4.7}Cu_{1.7}$, $Sn_{42}Bi_{58}$, $Sn_{90}Bi_{9.5}Cu_{0.5}$, $Sn_{99.3}Cu_{0.7}$, $Sn_{99}Cu_1$, $Sn_{97}Cu_3$, $Sn_{87.1}In_{10.5}Ag_2Sb_{0.4}$, $Sn_{77.2}In_{20}Ag_{2.8}$, $Sn_{63.6}In_{8.8}Zn_{27.6}$, $Sn_{97}Sb_3$ and $Sn_{95}Sb_5$.

The solder alloy is typically applied as a solder paste, which is a mixture of powdered solder metal alloy suspended or dispersed in a liquid vehicle. In general, at room temperature the solder paste is compliant enough so that it can be made to conform to virtually any shape. At the same time, it is tacky enough that it tends to adhere to any surface it is placed into contact with. These qualities make solder paste useful for forming solder bumps on electronic components or electronic device substrates. Typically, the solder paste is deposited by stenciling or screen printing. In one embodiment the solder paste is deposited onto the solder-wettable pads of the integrated circuit device. In another embodiment the solder paste is deposited onto the solder-wettable pads of the printed circuit board. In yet another embodiment solder paste is deposited on both the solder-wettable pads of the integrated circuit device and the printed circuit board. The solder can also be applied to the area array device in the shape of preformed solder spheres.

C. Epoxy Component

The epoxy component typically comprises epoxy resins that are considered to be thermoset, rather than thermoplastic. In general, thermoplastic materials are minimally crosslinked and become soft and deformable upon being heated. In contrast, thermoset materials are highly crosslinked and become hard and rigid upon being heated. Because of this and other differences, thermoset materials typically tend to provide more strength to the package (e.g., greater mechanical shock resistance and thermal cycling resistance) than thermoplastic materials. Despite not providing as much strength to an underfill, thermoplastic materials may be selected for inclusion in an underfill to provide a degree of reworkability.

The difference in the structure of thermoset and thermoplastic materials (i.e., the degree of crosslinking) is also reflected in the temperature-related properties of the epoxy component. Of particular interest is the glass transition temperature (Tg) of the cured epoxy component. The glass transition temperature is the temperature at which the polymer transforms from being solid-like and exhibiting an elastic deformation profile to being rubber-like and exhibiting a viscous deformation profile. Additionally, the transformation at Tg is typically associated with a substantial increase in the coefficient of thermal expansion (CTE) and a significant decrease in the storage or bulk modulus. Typically, the Tg of a thermoset material is greater than that of a thermoplastic material. For example, a cured thermoset material such as diglycidyl ether of bisphenol A (also referred to herein as a "bis-A epoxy resin") has a Tg of about 0 to about 220° C., whereas a thermoplastic material such as INCHEMREZ PHENOXY PKCP-80 has a Tg of about 30° C. In general, the epoxy component has a Tg of at least about 25° C. when cured. In one embodiment the epoxy component is selected to have a Tg of between about 30 and about 70° C. when cured. In yet another embodiment the epoxy is selected to have a Tg of between about 70 and about 155° C. when cured.

Additionally, the melt temperature (Tm) of the epoxy component is relevant. Specifically, the melt temperature, in conjunction with the purity of the epoxy component, allows for the underfill to be cured at a desirable temperature (e.g., a temperature within the range of about 50 to about 170° C.). The melt temperature of the polymer is the point at which significant dimensional deformation (e.g., between about 1 and about 5%) under a load of about 25 mN occurs during a static temperature ramp utilizing a thermomechanical analyzer. Typically, the melt temperature for the epoxy component is between about −50 and about 0° C. The epoxy component is also typically considered to be relatively pure. For example, the epoxy component preferably contains less than about 250 ppm for a hydrolyzable chloride.

The epoxy resin component may comprise any appropriate type of molecule that comprises at least one epoxide groups (i.e., it is at least monofunctional). Difunctional and/or multifunctional resins may be selected, alone or in combination with monofunctional resins, to increase to crosslink density, which increases the glass transition temperature of the underfill solution. More specifically, the epoxy resin component preferably comprises a glycidyl epoxy or a non-glycidyl epoxy resin. In general, glycidyl epoxies such as a glycidyl ether, a glycidyl ester, and/or a glycidyl amine are preferred over non-glycidyl epoxies because non-glycidyl epoxies tend to be more susceptible to moisture uptake. An appropriate epoxy resin component typically comprises an epoxy resin(s) that has a number of repeat units (i.e., degree of polymerization) that is between about 1 and about 7. Preferably, the number of repeat units is between about 1 and about 3.

The epoxy resin component typically comprises between about 20 and about 90 weight percent of the underfill solution. Although atypical, the concentration of the epoxy resin component may be varied to a concentration outside the foregoing range without departing from the scope of the present invention. Depending on the particular application, the concentration of the epoxy resin component may for example be as little as about 15 weight percent of the underfill solution or lower; or as great as 95 weight percent or more. Preferably, the epoxy resin component comprises between about 65 and about 75 weight percent of the underfill solution.

Depending on the desired characteristics of the underfill solution and/or the cured underfill, the epoxy resin component may comprise a single epoxy resin or a combination of epoxy resins. In one embodiment the epoxy resin component is selected from the group consisting of a diglycidyl ether of bisphenol A, a diglycidyl ether of bisphenol F, a triglycidyl ether of triphenomethane, a polyglycidyl ether of novolac, a polyglycidyl ether cresol novolac, a polyglycidyl ether of napthalenic phenol, and methyl, ethyl, propyl, and butyl substituted versions thereof. For example, it may be desirable to include a trifunctional epoxy resin to increase the amount of crosslinking in the cured underfill, which increases the Tg of the underfill. A polyglycidyl ether of cresol novolac may be included as part of the epoxy resin component in order to improve high temperature performance. A bis-A epoxy resin is typically included to increase the glass transition temperature and/or raise the viscosity of the underfill solution. Whereas a diglycidyl ether of bisphenol F (may herein be referred to as a "bis-F epoxy resin") is usually included to decrease the viscosity and/or improve high temperature performance. In view of the foregoing, in one embodiment of the epoxy resin component comprises a diglycidyl ether of bisphenol F, a triglycidyl ether of triphenomethane, and a polyglycidyl ether cresol novolac. Further, based on the foregoing concentration ranges for the epoxy resin component in general, in another embodiment the underfill solution comprises a diglycidyl ether of bisphenol F at a concentration that is between about 50 and about 70 weight percent, a triglycidyl ether of triphenomethane at a concentration that is between about 5 and about 15 weight percent, and a polyglycidyl ether cresol novolac at a concentration that is between about 2 and about 8 weight percent. Preferably, the underfill solution comprises a diglycidyl ether of bisphenol F at a concentration that is about 55 and about 65 weight percent, a triglycidyl ether of triphenomethane at a concentration that is between about 5 and about 10 weight percent, and a polyglycidyl ether cresol novolac at a concentration that is between about 2 and about 6 weight percent. For example, the concentration of diglycidyl ether of bisphenol F may be about 60 weight percent, the concentration of triglycidyl ether of triphenomethane may be about 7 weight percent, and the concentration of polyglycidyl ether cresol novolac may be about 4 weight percent.

The glass transition temperature and other properties such as the modulus of a cured epoxy resin component are largely dependent upon the "equivalent weight" of the epoxy resin component, which is based on the equivalent weights of the various epoxy resins that make up the epoxy resin component. The equivalent weight of an epoxy resin is equal to the molecular weight of the epoxy resin molecule divided by the number of epoxide groups the molecule contains. For example, a bis-A epoxy resin available from Resolution under the tradename EPON 828 has a molecular weight of about 380 g/mole and comprises two epoxide groups per molecule, which corresponds to an equivalent weight of about 190. A conventional bis-F epoxy resin available from Resolution under the tradename EPON 826, is bifunctional and has an equivalent weight of about 174. In general, the greater the equivalent weight the more flexible the cured epoxy will be because there is a greater distance between crosslink sites. Thus, to increase the stiffness and glass transition temperature, which is typically desirable in an underfill, epoxy resins with smaller equivalent weights or higher functionalities may be included as part of the epoxy resin component. In addition to affecting the physical properties of the epoxy resin, the equivalent weight also plays a role in determining the amount of fluxing curative that is included in the underfill solution. For example, the smaller the overall equivalent weight of the epoxy resin component (i.e., the equivalent weight of the epoxy resin component as a whole based on the relative amounts of the different epoxy resins that make up the epoxy resin component), the greater the number of epoxide crosslink sites for a given amount of epoxy resin component, and therefore, the greater the amount of fluxing curative that is needed to cure the epoxy resin component during solder reflow.

D. Fluxing Curative

In addition to the epoxy resin component, the underfill solution comprises a fluxing curative that comprises an imidazole-carboxylic acid salt (hereinafter referred to as the "salt") formed by reacting an imidazole component with a carboxylic acid component. The carboxylic acid binds the imidazole component as part of a compound that is substantially non-reactive with the epoxy resin component or other underfill constituents until the underfill is heated (e.g., to at least about 40° C.). Typically, the concentration of the fluxing curative is between about 1 and about 30 weight percent of the underfill solution. Preferably, the concentration of the fluxing curative is between about 5 and about 20 weight percent of the underfill solution. More preferably, the fluxing curative comprises between about 10 and about 15 weight percent of the underfill solution.

The non-reactive nature of the salt imparts latency to the underfill solution. As used herein, the term "latency" describes the degree of reaction between the underfill constituents and/or the extent of curing. Advantageously, the fluxing curative does not completely cure the epoxy resin component until after the solder balls have collapsed and the solder connections are formed during a solder reflow operation. Stated another way, the cure is sufficiently slow so as to not interfere with the collapse of the solder bumps. Thus, the underfill solution is considered to be latent. The latent nature of the underfill solution allows for it to be applied to an integrated circuit device or substrate prior to solder reflow (i.e., it is a no-flow underfill) instead of after a reflow operation via capillary action. Additionally, the latent nature allows for the underfill to be stored for extended periods of time without detriment to its application or to solder reflow. For example, when maintained at conventional storage temperatures of between about 20 and about 30° C., the underfill solution undergoes less than about a 20% increase in viscosity over a period of 24 hours immediately following its formation. As such, the underfill solution is considered to have a pot life of at least about 24 hours. The latent nature and viscosity of the underfill solution allows the underfill solution to flow prior to, and after, attaining the maximum temperature during a solder reflow operation, which minimizes the occurrence of voids and maximizes the bonding between the underfill, the device, and the substrate. Typically, the underfill solution has a viscosity within the range of about 1 centipoise to about 20,000 centipoise at a temperature between about 50° C. and a maximum reflow temperature (e.g., about 170° C.).

One measure of the underfill solution's latency is its gel point. In general, at the beginning of a cure the viscous modulus (loss modulus) is greater than the elastic modulus (storage modulus). As the cure proceeds both the elastic and viscous moduli increase, but they increase at different rates. Eventually, the elastic modulus equals and then exceeds the viscous modulus. The gel point is the point during the cure when the elastic modulus equals the viscous modulus. Prior to reaching the gel point, the epoxy resin component generally behaves like a liquid; after reaching the gel point, the epoxy resin component generally behaves like a solid. Because the gel point depends upon the kinetics of the reaction between the epoxy resin component and the fluxing curative, it depends upon temperature and the rate at which a particular temperature is reached. In general, as the rate at which an underfill solution is heated increases, the temperature at which the gel point occurs also increases.

In view of the foregoing, the epoxy resin and/or the fluxing curative are selected so that the gel point is reached upon or after reaching the liquidus temperature of the solder. This allows for the solder bumps to collapse and provide a secure and electrically conductive connection between the integrated circuit device and the printed circuit board. Preferably, the gel point occurs when between about 50 and about 70% of the epoxy component is cured. More preferably, the gel point occurs when between about 55 and about 65% of the epoxy resin component is cured. Depending on the polymer, however, the gel point may occur when as little as about 30% or as much as about 95% of the epoxy resin component is cured.

Upon being heated during a solder reflow operation, the imidazole-acid salt dissociates and the dissociated carboxylic acid portion is free to flux (i.e., remove oxides and other impurities) from the solder and the surfaces of the metal pads and the dissociated imidazole portion catalyzes, initiates, participates in, and/or causes the cure of the epoxy resin component. This salt is preferably selected so that the dissociation occurs at a temperature below the melting of the solder so that fluxing may occur prior to the collapse of the solder bumps. Depending on the desired degree of latency, the salt may be formulated to dissociate at a temperature between, for example, about 40 and about 170° C. Typically, the salt is formulated to dissociate at a temperature that is at least about 30° C. below the melting temperature of the solder alloy. Preferably, the salt is formulated to dissociate at a temperature that is between about 20 and about 170° C. below the melting point of the solder alloy. For example, when using a low melting solder such as an eutectic Pb—Sn alloy, the salt is typically formulated to dissociate at a temperature that is between about 50 and about 150° C. The dissociation temperature of the salt may be set or adjusted by the selection of the particular imidazole compound(s) and the carboxylic acid compound(s) and their amounts used to form the salt. In general, the dissociation temperature increases with the strength of the carboxylic acid and/or with the molecular weight of the acid.

1. Imidazole Component

The imidazole component comprises imidazole, isoimidazole, a substituted imidazole, or a combination thereof. In general, imidazole compounds are considered to be efficient Lewis-Base catalysts that initiate the cure of the epoxy resin component through anion homopolymerization. The kinetics of the underfill cure depend, in large part, on the type and amount of imidazole compound(s) selected for inclusion. Thus, for any particular reflow operation, the cure kinetics or process window may be tailored by the selection of the imidazole component in order to suit, for example, the particular substrate, device, solder alloy, and/or reflow temperature profile.

Depending on the particular imidazole compound(s) selected to comprise the imidazole component, the imidazole component may be a liquid, a solid, or a combination of the two physical states at about room temperature (about 20° C.). In general, a solid imidazole compound tends to begin curing an epoxy at a higher temperature and/or after a longer period of time than a liquid imidazole compound. Therefore, a solid imidazole compound is typically considered to be desirable for relatively high temperature and/or longer reflow operations associated with Pb-free solder alloys. Conversely, liquid imidazole compounds tend to be preferred for reflow operations that reach lower temperatures and/or are relatively short such as those performed using a bonder device instead of a furnace.

In one embodiment the imidazole component is selected from an alkyl-substituted imidazole and an aryl-substituted imidazole. Preferably, the imidazole component comprises a substituted imidazole from an alkyl-substituted imidazole having up to about 17 carbon atoms in the alkyl substituent and an aryl-substituted imidazole having up to about 10 carbon atoms in the aryl substituent. More preferably, the alkyl-substituted imidazole has up to about 8 carbon atoms in the alkyl substituent and the aryl-substituted imidazole has up to about 10 carbon atoms in the aryl substituent. Still more preferably, the imidazole component is an alkyl-substituted imidazole selected from the group consisting of 2-methyl imidazole, 2-ethyl-4-methylimidazole, 2,4-dimethylimidazole, butylimidazole, 2-undecenylimidazole, 1-vinyl-2-methylimidazole, 2-n-heptadecylimidazole, 2-undecylimidazole, 2-heptadecylimidazole, 1-propyl-2-methylimidazole, 1-cyanoethyl-2-methylimidazole, 1-cyanoethyl-2-ethyl-4-methylimidazole, 1-cyanoethyl-2-undecylimidazole, 1-cyanoethyl-2-phenylimidazole, 1-guanaminoethyl-2-methylimidazole, addition products of an imidazole and trimellitic acid, and 2-n-heptadecyl-4-methylimidazole. In one particular embodiment the imidazole component comprises 2-ethyl 4-methyl imidazole, 1-cyanoethyl-2-ethyl 4-methyl imidazole, or a combination thereof. To increase the latency of the underfill solution, the 1-cyanoethyl-2-ethyl 4-methyl imidazole may be preferred because of the stearic hindrance associated with the side group substitution. Many, if not all, of the foregoing imidazole compounds are commercially available from Air Products, Inc. under the CUREZOL trademark. Additional suitable imidazole compounds are available from Hokko Chemical and Borregaard Synthesis.

As set forth above, the imidazole component is introduced into the underfill solution in the form of a salt or a salt-imidazole-acid mixture. In many circumstances, however, it is convenient to describe the underfill solution in terms of the amount of imidazole component therein as if it were not added as a salt. In general, the concentration of imidazole component is selected so that it is at least sufficient to catalyze the homopolymerization of the epoxy resin component. Thus, the amount of imidazole component depends, in large part, on the degree of functionality of the epoxy resin component. In other words, the greater the degree of crosslinking to be achieved as part of the cure, the greater the amount of imidazole component that tends to be included in the underfill solution. As mentioned above, the control of the cure kinetics is a further consideration when selecting the amount of imidazole. For example, an underfill solution that when cured is minimally crosslinked (e.g., an underfill solution comprising an epoxy component having an epoxide equivalent weight that is between about 90 and about 2000) the concentration of imidazole component is typically between about 0.1 and about 9 weight percent. In comparison, to adequately cure a highly functionalized epoxy resin component (e.g., an epoxide equivalent weight that is between about 70 and about 350) the concentration of imidazole component is typically between about 3 and about 9 weight percent. To cure a moderately functionalized epoxy resin component (e.g., an epoxide equivalent weight that is between about 170 and about 450) the concentration of imidazole component is typically between about 2 and about 7 weight percent.

As mentioned above, the concentration of the imidazole component also affects the rate of cure for the epoxy resin. Specifically, the greater the concentration of the imidazole component in the underfill solution, the faster the cure. For example, an underfill solution subjected to a relatively slow reflow ramp rate of between about 1.5 and about 2.5° C./sec, which is typical of a furnace reflow, may comprise between about 1 and about 3 weight percent. This amount is based on the use of a typical resin stoichiometry such as a bis-A epoxy resin having an equivalent weight of about 190. The mount of imidazole component may also be adjusted for the changes in the temperature ramp rate. For example, a relatively fast reflow ramp rate (e.g., between about 5 and about 120° C./sec), which is typical of bonder devices, the underfill solution may comprise between about 2 and about 9 weight percent of the imidazole component based on a typical resin stoichiometry.

In view of the foregoing, the minimum concentration of the imidazole component in the underfill solution, in the form of the salt, is typically at least about 0.5 percent by weight. Preferably, the concentration of imidazole component in the underfill solution is between about 0.5 and about 10 weight percent. More preferably, the concentration of imidazole component is between about 0.5 and about 7 weight percent of the underfill solution. Still more preferably, the concentration of imidazole component is between about 2 and about 5 weight percent.

As set forth above, an underfill solution that relies primarily on an anhydride compound as the curing agent is cured via addition cure wherein the anhydride curing agent or a derivative thereof is incorporated in the cured epoxy structure (i.e., the anhydride curing agent, a derivative, or a portion thereof becomes at least a part of the crosslink). As a result, the anhydride compound typically comprises between about 40 and about 80 weight percent of the solution. In contrast, the imidazole component typically catalyzes the cure of the epoxy resin component with no more than about 10 weight percent.

Still further, unlike anhydride compounds, which form crosslinks with ester linkages, the imidazole component homopolymerizes the epoxy component in a manner that results in ether-containing crosslinks. As set forth above, ester linkages are susceptible to degradation when exposed to moisture and this tends to result in premature failure of the electronic assembly. The ether linkages, however, are significantly less susceptible to moisture, which tends to maximize the reliability performance of the underfilled device during moisture level sensitivity tests followed reflow exposure or during a HAST exposure.

In view of the foregoing, although it is not required that the underfill solution be free of anhydride compounds, it is generally preferred that the concentration of anhydride compounds be minimized to reduce the propensity for void formation and degradation from exposure to moisture. As such, the underfill solution is preferably substantially free of anhydride compounds (e.g., the concentration of anhydride is less than about 10, 5, 1, or 0.5 weight percent of the underfill solution). Preferably, the underfill solution is entirely free of anhydride compounds.

2. Carboxylic Acid Component

The carboxylic acid component used to form the fluxing curative, in addition to binding the imidazole component, provides the fluxing action necessary for soldering by removing oxides and other impurities from all surfaces involved in the soldering operation (e.g., metal pads and solder alloy powder). Further, the carboxylic acid component protects against oxidation during, and for a sufficient duration after, the reflow operation.

Many of the characteristics of the carboxylic acid are not overly critical. For example, the carboxylic acid may be saturated or unsaturated; a solid or liquid at room temperature or a combination of the states; monofunctional, difunctional, or polyfunctional. Of significance, however, is the number of carbon atoms in the carboxylic acid(s). Specifically, the carboxylic acid component comprises one or more carboxylic acids that have enough carbon atoms so that the acid has a large enough molecular weight, and/or tends to be stable enough, for use as a fluxing agent for eutectic and/or Pb-free solders. Typically, such carboxylic acids comprise at least about 10 carbon atoms per molecule in order to ensure the fluxing capabilities upon being dissociated. This is because lower molecular weight carboxylic acids tend to decompose or evaporate at reflow temperatures, especially at the relatively high temperatures reached when using Pb-free solder alloys. For example, if a salt formed by reacting an imidazole and a monocarboxylic acid having from 1 to 8 carbon atoms were used in an underfill solution, the dissociated monocarboxylic acid would be too volatile for effective fluxing.

In accordance with the invention, the carboxylic acid may comprise a monocarboxylic acid having at least about 15 carbon atoms, a dicarboxylic acid having at least about 10 carbon atoms, or a combination thereof. An example of an appropriate monocarboxylic acid having at least about 15 carbon is isostearic acid (isooctadecanoic acid, 16-methyl-heptadecanoic acid, $C_{18}H_{38}O_2$), which comprises 18 carbon atoms. The carboxylic acid component may also comprise a monocarboxylic acid having at least about 20 carbon atoms, a dicarboxylic acid having at least about 12 carbon atoms, or a combination thereof. Appropriate monocarboxylic acids with at least about 20 carbon atoms include, for example, behenic acid ($C_{22}H_{44}O_2$), and abietic acid ($C_{20}H_{30}O_2$). Appropriate dicarboxylic acids comprising at least about 12 carbon atoms include, for example, dodecanedioic acid ($C_{12}H_{22}O_4$), and a dodecanedicarboxylic acid such as dodecanedicarboxylic-1,11 acid ($C_{13}H_{24}O_4$) and dodecanedicarboxylic-1,12 acid ($C_{14}H_{26}O_4$). Still further, the carboxylic acid component may comprise one or more dicarboxylic acids having at least about 20 carbon atoms. One such carboxylic acid is 5-n-hexyl-2-(carboxyl-n-heptyl) cyclohex-3-ene carboxylic acid, which is a liquid monocyclic 21 carbon dicarboxylic acid derived from tall oil fatty acids and is commercially available from Westvaco of Charleston, S.C. under the tradename DIACID 1550. Other appropriate higher weight carboxylic acids include tall oil fatty acids (linoleic and oleic acids) such as SYLFAT FA2 from Arizona Chemical or isostearic acid sold as CENTURY 1107 from Arizona Chemical.

To form a completely fused and strong solder joint, the solder must adequately wet the solder pad and/or lead. Wetting depends in large part on the metallurgical reaction between the solder and metal pads, and on the efficacy of any intrinsic and/or extrinsic fluxing agent that is present. Thus, if the fluxing does not adequately remove oxides from the metals being joined during the reflow operation, the oxides retard or prohibit the intermetallic formation. Additionally, the joint will typically be incompletely fused, weak, and subject to forming a void in the solder joint. Without being held to a particular theory, it is presently believed that the mechanism behind void formation is the entrapment of excess flux or its vapors within the solder alloy. Thus, in addition to selecting a thermally stable carboxylic acid, the concentration of the carboxylic acid component is preferably selected so as to be sufficient to reduce the metal oxides in the solder alloy and on the solderable surfaces without being so great as to create voids. Additionally, if the concentration of the carboxylic acid component is too great, the cured underfill may comprise a carboxylic acid-epoxy copolymer, which typically results in the cured underfill having relatively low Tg due to the plasticizing effect of the acid and a rubber-like consistency. In view of these concerns, the concentration of carboxylic acid component is usually no greater than about 15 weight percent of the underfill solution. Preferably, the concentration of the carboxylic acid component is at least about 1 weight percent. More preferably, the concentration of the carboxylic acid component is between about 2 and about 12 weight percent. Still more preferably, the concentration of the carboxylic acid is between about 5 and about 10 weight percent of the underfill solution.

3. Formation of the Fluxing Curative

The salt is formed by mixing the imidazole component with the carboxylic acid component at a temperature and for a duration sufficient to form the salt. The mixing may be accomplished using any type of appropriate mixing device such as a single shaft, high shear mixer or a planetary mixer. While mixing, heat is typically applied to drive the reaction. The mixture is typically heated to a temperature that is between about 20 and about 100° C. for a duration that is between about 5 minutes and about 48 hours. In general, as the temperature increases the duration needed react substantially all the imidazole component with the carboxylic acid component decreases. Preferably, the mixture is heated to a temperature between about 60 and about 70° C. for a duration that is between about 1 hour and 12 hours.

As mentioned above, the imidazole component and the carboxylic acid component may comprise compounds that are a liquid or a solid at about room temperature. Preferably, any of solid constituents are dissolved in an appropriate solvent prior to being mixed. Additionally, the salt may be relatively viscous (e.g., the consistency of tar) and the use of a solvent to reduce the viscosity is typically desirable to ease the mixing of the salt with the other underfill solution constituents. The particular solvent or solvent blend is not overly critical, but it should readily dissolve the constituents and be compatible therewith. Preferably, the solvent also has evaporation and boiling points that are high enough so that it is considered easy and safe to handle yet low enough to allow for removal of the solvent at room temperature or in a drying oven, if desired. For example, the evaporation point of an appropriate solvent is typically between about 70 and about 170° C. and the boiling point is typically between about 90 and about 130° C. Appropriate solvents include many polar solvents such as ketones (e.g., acetone, methyl ethyl ketone, methyl isobutyl ketone, cyclohexanone), esters (e.g., ethyl lactate, dibasic esters, ethylene glycol ethylether acetate, diethyleneglycol ethylether acetate, propyleneglycol methylether acetate, hexanediol diacrylate, phenoxy ethyl acrylate, ethoxyethyl propionate), alcohols (e.g., methanol, ethanol, isopropyl alcohol, benzyl alcohol, methylcellosolve, ethylcellosolve, 1-methoxy-2-propanol, carbitol and butylcarbitol), and combinations thereof. One particularly useful solvent that is inexpensive and readily available is acetone. The amount of solvent used is not particularly important, but it is generally as little as necessary to assure adequate mixing (e.g., less than about 50 weight percent).

To form the salt, the imidazole component and carboxylic acid component are preferably mixed together at a ratio that is at least sufficient to achieve the desired degree of latency. This minimum ratio depends in large part on the imidazole compound(s) that make up the imidazole component because solid imidazole compounds tend to be more latent than liquid imidazole compounds. Thus, as the relative amount of solid imidazole compound(s) increases compared to liquid imidazole compounds(s), the ratio of imidazole component to carboxylic acid component incorporated into the salt that is necessary to achieve a desired degree of latency tends to decrease. An acceptable degree of latency may be attained by a weight ratio of imidazole component to carboxylic acid component that is no more than about 1:0.1. Although an excess of imidazole component is typically not preferred, it may be acceptable if the particular imidazole compound(s) are relatively latent. On the other hand, an excess of the carboxylic acid component is not overly critical, provided that it does not result in the aforementioned problems (e.g., void formation in the solder joint and rubber-like consistency of the cured underfill). Thus, in addition to the salt, the fluxing curative may comprise a portion of the imidazole component and/or the carboxylic acid component that is/are unreacted. In view of the foregoing, the weight ratio of the imidazole component to the carboxylic acid component is typically at least about 1:4. Preferably, the weight ratio of imidazole component to carboxylic acid component is between about 1:3 and about 1:1. More preferably, the weight ratio of imidazole component to carboxylic acid component is about 1:2.

E. Miscellaneous Additives

Although not required, other additives, such as wetting agents, defoaming agents, coupling agents, stress reducing agents, and fillers may also be included in the underfill. A wetting agent is typically added to improve the film forming properties of the underfill and/or to enhance the bonding of the underfill to the surfaces of the integrated circuit device and printed circuit board by decreasing the surface tension of the underfill. Appropriate wetting agents include the following classes of materials: modified silicone resins, fluorocarbons, and acrylic resins. The most commonly used type of wetting agent in underfills are silanes. One such commercially available silane-type wetting agent is available from Byk Chemie of Wesel, Germany under the trade name BYK 306. If present, the concentration of a wetting agent in the underfill solution is typically kept near the minimum concentration at which effective wetting is accomplished because high concentrations can actually decrease adhesion. In general, the concentration of wetting agent is between about 0.005 and about 2.0 weight percent of the underfill solution. Preferably, the concentration of the wetting agent is between about 0.1 and about 0.5 weight percent of the underfill solution. It is to be noted that the BYK 306 wetting agent only contains 12 percent by weight wetting agent with the remainder being solvent. Thus, adding about 0.5 weight percent of BYK 306 to the underfill solution corresponds to adding about 0.06 weight percent wetting agent and about 0.44 weight percent of a solvent.

Defoaming agents, if present, are typically added prior to, or during, the mixing of the epoxy resin component, the fluxing curative, and the solvent to assist in the degassing of the underfill solution. Stated another way, a defoaming agent tends to minimize the formation of pockets of entrapped air in the underfill solution. Such pockets of entrapped air tend to result in the formation of voids in the cured underfill that typically degrade the adhesion and the thermal stress compensation effect of the underfill. Appropriate defoaming agents include the classes of materials of polyether modified siloxanes and methylalkyl siloxanes. The most commonly used defoaming agents comprise modified polysiloxanes. Specific examples of such defoaming agents include BYK 525, BYK 530, and BYK 535 available from Byk Chemie of Wesel, Germany. Another type of defoaming agent that comprises a modified polydimethylsiloxane is commercially available from Crompton of Middlebury, Conn. under the trade name SAG 100. If present, the concentration of a defoaming agent in the underfill solution is typically kept near the minimum concentration at which effective degassing is accomplished because high concentrations can decrease adhesion. In general, the concentration of defoaming agent is no greater than about 1 weight percent of the underfill solution. Preferably, the concentration of defoaming agent is between about 0.05 and about 0.5 weight percent of the underfill solution.

A cured epoxy resin typically has a coefficient of thermal expansion (CTE) that is between about 50 and about 80 ppm/° C. and acts to reduce the CTE mismatch between the solder and the substrate materials. To still further reduce any CTE mismatch between the integrated circuit, the solder, and the circuit board, the underfill solution may comprise a coefficient of thermal expansion modifier component, which is often referred to as a filler. The CTE modifying component has a CTE that is more compatible with the substrates (e.g., the flip chip and circuit board) thereby decreasing the thermal stress upon thermal cycling. The CTE modifying component is electrically insulating and has a CTE that is preferably less than about 10 ppm/° C. Exemplary CTE modifying component materials include beryllium oxide (about 8.8 ppm/° C.), aluminum oxide (about 6.5–7.0 ppm/° C.), aluminum nitride (about 4.2 ppm/° C.), silicon carbide (about 4.0 ppm/° C.), silicon dioxide (about 0.5 ppm/° C.), low expansion ceramic or glass powders (between about 1.0 to about 9.0 ppm/° C.), and mixtures thereof. If present, the CTE modifying component preferably comprises silicon dioxide.

The maximum particle size of the CTE modifying component (i.e., the maximum cross-sectional distance of the particle) is preferably less than the height of the solder bumps to minimize any negative impact on solder joint integrity. Typically, the average particle size of conventional CTE modifying materials is between about 0.5 and about 15 μm. Nanoparticle filllers, which typically have a mean particle size of about 10 nm to 500 nm, may also be used. Although the amount of the filler in the underfill depends on the particular application, if present, the amount of CTE modifying component suspended or dispersed in the underfill solution is typically between about 10 and about 90 weight percent of the underfill solution.

A leveling agent may be included to decrease the surface tension of the underfill solution, which allows the underfill solution to flow more readily during application of the solution and/or during placement of the electronic component to the substrate having the underfill solution deposited thereon. Additionally, the leveling agent may also enhance the ability of the underfill solution to wet the surface(s) being bonded. Conventional leveling agents fall within three categories: 1) fluorosurfactants; 2) organomodified silicon;

and 3) and acrylics. The leveling agent may comprise any one or more of the foregoing leveling agent types. If present, the leveling agent typically comprises between about 0.01 and about 1.2 weight percent of the underfill solution. For example, in one embodiment the underfill solution comprises a leveling agent at a concentration that is about 0.5 weight percent of the underfill solution.

A toughening agent may be included in the underfill solution to improve the fracture toughness and act as a stress reducing agent. Typically, the toughening agent comprises submicron particles of a silicone resin, acrylic based core shell rubber, or a carboxyl terminated butadiene resin. If present, the concentration of the toughening agent is between about 0.5 and about 30 weight percent of the underfill solution.

A silane coupling agent may be included in the underfill solution to improve the adhesion of the underfill to various substrates. Typically, a silane coupling agent comprises organomodified silicon molecules. If present, the concentration of the silane coupling agent is at a concentration that is between about 0.5 to about 2 weight percent of the underfill solution. In embodiment the silane coupling agent comprises about 0.5 weight percent of the underfill solution.

F. Preparation of the Underfill Solution

In general, the underfill solution is prepared by mixing together the various constituents. Typically, the preparation process comprises mixing the selected constituents in, for example, a planetary mixer. If desired, some solvent may be added to assist in the mixing. Typically, the epoxy resin and the salt are mixed together until the mixture is uniform before any remaining constituents such as wetting agents, defoaming agents, and CTE modifiers are dissolved or mixed into the solution. Preferably, the mixing process is performed under a vacuum to reduce or eliminate the entrapment of gas in the underfill solution.

G. Application and Curing of the Underfill Solution

Referring to the schematic drawing in FIG. 1, a deposit 3 of underfill solution 1 is deposited using a needle-type deposition device represented by syringe 2 (e.g., a CAMALOT available from Cookson Electronics of Franklin, Mass.) onto at least a portion of the surface 11 of the substrate 10 and/or the metal pads 12 of the substrate 10. As used herein, the term "substrate" is intended to mean a circuit board, a chip carrier, a semiconductor device, a metal lead frame, or a similar electronic device substrate. It is generally preferred that the volume of the deposit 3 is such that the thickness of the underfill solution, when spread across the surface of the substrate upon placement of the electronic component, results in proper formed fillets on the sides of the device. In one embodiment, the volume of the deposit 3 is such that the thickness of the underfill after placement of an integrated circuit device is between about 50 and about 95 percent of the solder bump height. In another embodiment the volume of the deposit 3 is such that the thickness of the underfill after placement of an integrated circuit device is between about 70 and about 170 percent of the solder bump height. Because the underfill comprises the fluxing curative, the underfill material may cover the metal pads 12 and/or solder bumps 20. In fact, it is preferred that the underfill solution cover the pads 12 and/or solder bumps 20 because, in so doing, the pads/bumps will be protected from oxidation, contamination, and mechanical damage. An integrated circuit device 22 may now be applied to a substrate. Specifically, the integrated circuit device 22 is typically placed and aligned to the bond pads of a substrate using a pick and place machine (e.g., a SIPLACE available from Siemens). Application of the integrated circuit device to the substrate typically displaces and compresses the deposit 3 substantially evenly over the portion of the substrate surface 11 and pads 12 that the device overlies. The substrate 10 and the integrated circuit device 22, after being positioned on the substrate, are then typically run through a multi-zone oven with individual heat controls that permit a heating profile appropriate for the specific solder. During reflow, the fluxing curative dissociates and the dissociated carboxylic acid portion reduces oxides present in the solder or on the surfaces of the metal pads and allows formation of solder connections between the substrate and electronic component. Further, the dissociated imidazole portion catalyzes the homopolymerization of the epoxy resin component. Additionally, the epoxy resin component and the other components sufficiently flow and wet the surfaces of the integrated circuit device and substrate. As the temperature is increased to the solder liquidus and higher, the epoxy resin component continues to crosslink and cure. The assembly 30 is then allowed to cool, which solidifies the solder and results in the integrated circuit device 22 and the substrate 10 being bonded together with at least one solder joint 34 and the cured underfill 33.

Alternatively, a flip chip bonder that applies heat and pressure may be employed instead of the reflow oven. In this embodiment the integrated circuit device is placed in contact with the conductive pads on the circuit board and heat from the bonder head dissociates the fluxing curative, cures the underfill, and reflows the solder bumps. The use of a flip chip bonder allows a flip chip to be assembled to a board that already has components mounted thereto.

H. Example

Three imidazole-acid salts were evaluated to determine their relative reactivities for use in either eutectic or lead free solder applications. The imidazoles that were investigated were CUREZOL 2PHZS, CUREZOL 2MZ-AZINE, and CUREZOL C17Z. The acid was WESTVACO DIACID 1550. The acid-salts were prepared by combining one part by weight of an imidazole to two parts by weight of the acid in a 4 ounce (about 130 mL) polypropylene jar. Next, acetone was added to the volume of acid and salt in amount equal of between about 70% and about 100% of the combined weight of the acid and the salt. The acetone was added to facilitate the incorporation of the solid imidazole into the liquid acid. The three jars were sealed and placed on a jar mill and allowed to roll at high speed for about 60 minutes. The jars containing the acetone, the imidazole, and the acid were then placed on a hot plate that was at a temperature between about 100° C. and about 120° C. for approximately two hours to evaporate the acetone and to form the salt. After being heated for about two hours, the jars were allowed to cooled to room temperature (about 20° C.).

After being cooled, the acid-salts were then mixed with additional resin system components for evaluation of the acid-salts. The formulations of the resin systems are set forth in Table A.

TABLE A

| Resin System Components | 0032-18-1 | 0032-18-2 | 0032-18-3 |
|---|---|---|---|
| EPICLON 830 LVP | 61.04% | 61.04% | 62.10% |
| ALBIDUR 2240 | 7.19% | 7.19% | 7.32% |
| ARADUR MY-0510 | 7.19% | 7.19% | 7.32% |
| MASTERBATCH 56-2 | 12.51% | 12.51% | 12.73% |
| CUREZOL C17Z-SALT | 9.62% | — | — |
| CUREZOL 2MZ-AZINE | — | 9.62% | — |

TABLE A-continued

| Resin System Components | 0032-18-1 | 0032-18-2 | 0032-18-3 |
|---|---|---|---|
| CUREZOL 2PHZS-SALT | — | — | 9.79% |
| SILQUEST A-187 | 0.53% | 0.53% | 0.10% |
| BYK A530 | 0.53% | 0.53% | 0.10% |
| BYK-W9010 | 0.96% | 0.96% | — |
| SKW DYHARD 100S | 0.43% | 0.43% | 0.44% |
| SILWET 7608 | — | — | 0.10% |
|  | 100.00% | 100.00% | 100.00% |

The ingredients of the resin systems were added to 4 ounce polypropylene jars and mixed for about 40 seconds with a centrifugal SPEED MIXER agitation device. It should be noted that the CUREZOL 2MZ-AZINE was incompatible with one or more of the other system components, therefore, this resin system was not subjected to further testing.

The testing of the 0032-18-1 and 0032-18-3 resin systems comprised measuring the viscosity of each system using a BROOKFIELD HBDVIII+ viscometer and CPE51 spindle at 10 revolutions per minute. Additionally, the testing comprised measuring the exothermic peak temperatures of the resin systems to evaluate the cure kinetics of the resin system. In general, as the exothermic peak temperature increases the cure rate of the resin system decreases. The exothermic peak temperature were measured using a PERKIN ELMER DSC6 operated from about 25° C. to about 275° C. at a heating rate of about 10° C. per minute. The viscosity and peak temperature measurements for the resin systems are set forth in Table B.

TABLE B

| Resin System | 10 rpm Viscosity (cP) | Exothermic Peak Temp. (° C.) |
|---|---|---|
| 0032-18-1 | 2320.6 | 43.9 |
| 0032-18-3 | 1864.8 | 173.7 |

The resin systems were then evaluated for fluxing suitability utilizing eutectic solder spheres on copper coupons. A sample of each resin system was deposited onto a coupon and three solder spheres were placed in the deposit in a triangular formation. A glass cover slip was placed on top of the three solder spheres and then the coupons heated according to a typical eutectic reflow profile. The relative fluxing and kinetic acceptability of the resin systems were evaluated by examining the solder spread on the coupons and by visual inspections for the formation of voids under the cover slide. The evaluation of the 0032-18-1 indicated the cure speed for the resin system was too fast for the eutectic solder, which tends to reflow at a temperature lower than Pb-free solder reflow temperatures. Specifically, the rapid cure prevented the collapse of the solder balls. In contrast, the 0032-18-3 resin system allowed the solder balls to collapse. But the reflowed material contained voids and was tacky. The 0032-18-3 resin system was then evaluated with tin-silver-copper alloy solderballs in a similar manner, but according to a typical lead-free reflow profile. Again, the solderballs collapsed, but the reflowed material contained voids.

The 0032-18-3 resin system was then evaluated in a no-flow application using lead-free 5 mm×5 mm Delphi FA10 test dies and corresponding substrates matching the bump pattern of the test dies. The resin system was dispensed on substrates and the dies were placed on the substrates using a FINETECH PICOPLACEMENT machine. The assemblies were subjected to a standard lead-free reflow profile. After completing the reflow operation, the fillets were tacky, which indicated that resin system had not fully cured. Then the assemblies were tested for electrical continuity and for voids with scanning acoustic microscopy. The devices exhibited electrical continuity and a number of voids.

Due to the wide process window of the 0032-18-3 system (slow cure kinetics) and the narrow process window of 0032-18-1 system (fast cure kinetics) the two systems were blended at different ratios in an attempt to reduce voiding while still allowing an adequate interconnect (electrical continuity). It was determined that according to this particular reflow profile the optimum ratio of 0032-18-1 to 0032-18-2 was about 28 parts to about 72 parts. This ratio allowed adequate interconnection, which was evidenced by electrical continuity through the die and substrate, and minimized void formation. Of course, other ratios of the foregoing resins may also yield acceptable results by adjusting the reflow profile (e.g., by adjusting the duration, the maximum temperature, and/or heating rate).

It is to be understood that the above description is intended to be illustrative and not restrictive. Many embodiments will be apparent to those of skill in the art upon reading the above description. The scope of the invention should therefore be determined not with reference to the above description alone, but should be determined with reference to the claims and the full scope of equivalents to which such claims are entitled.

When introducing elements of the present invention or the preferred embodiment(s) thereof, the articles "a", "an", "the" and "said" are intended to mean that there are one or more of the elements. The terms "comprising", "including" and "having" are intended to be inclusive and mean that there may be additional elements other than the listed elements.

The recitation of numerical ranges by endpoints includes all numbers subsumed within that range. For example, a range described as being between 1 and 5 includes 1, 1.6, 2, 2.8, 3, 3.2, 4, 4.75, and 5.

What is claimed is:

1. A fluxing curative for curing an underfill that comprises an epoxy resin and for fluxing a solder during a solder assembly of an electronic component to an electronic device substrate, the fluxing curative comprising a salt that is a reaction product of an imidazole component and a carboxylic acid component having at least 10 carbon atoms per molecule, wherein the carboxylic acid component is isostearic acid, 5-n-hexyl-2-(carboxyl-n-heptyl) cyclohex-3-ene carboxylic acid, or a combination thereof.

2. An underfill solution for application between an electronic component and an electronic device substrate to assist in solder assembly of the electronic component to the electronic device substrate and to provide mechanical shock resistance and thermal cycling resistance, the underfill solution comprising an epoxy resin component and a fluxing curative for curing the epoxy resin component and for fluxing a solder during the solder assembly, the fluxing curative comprising a salt that is a reaction product of an imidazole component and a carboxylic acid component having at least 10 carbon atoms per molecule.

3. The underfill solution of claim 2 wherein the epoxy resin component is at a concentration that is between about 20 and about 95 weight percent of the underfill solution and the fluxing curative is at a concentration that is between about 1 and about 30 weight percent of the underfill solution.

4. The underfill solution of claim 2 wherein the epoxy resin component is at a concentration that is between about 65 and about 75 weight percent of the underfill solution and the fluxing curative is at a concentration that is between about 1 and about 30 weight percent of the underfill solution.

5. The underfill solution of claim 2 wherein the imidazole component is at a concentration that is between about 0.1 and about 9 weight percent of the underfill solution.

6. The underfill solution of claim 2 wherein the imidazole component is at a concentration that is between about 2 and about 7 weight percent of the underfill solution.

7. The underfill solution of claim 2 wherein the carboxylic acid component is at a concentration that is no greater than about 15 atomic percent of the underfill solution.

8. The underfill solution of claim 2 wherein the carboxylic acid component is at a concentration that is between about 2 and about 12 atomic percent of the underfill solution.

9. The underfill solution of claim 2 wherein the carboxylic acid component is at a concentration that is between about 5 and about 10 atomic percent of the underfill solution.

10. The underfill solution of claim 2 wherein the epoxy resin component is selected from the group consisting of a diglycidyl ether of bisphenol A, a diglycidyl ether of bisphenol F, a triglycidyl ether of triphenomethane, a polyglycidyl ether of novolac, a polyglycidyl ether cresol novolac, a polyglycidyl ether of napthalenic phenol, and methyl, ethyl, propyl, and butyl substituted versions thereof.

11. The underfill solution of claim 2 wherein the epoxy resin component comprises diglycidyl ether of bisphenol F, a triglycidyl ether of triphenomethane, and a polyglycidyl ether cresol novolac.

12. The underfill solution of claim 2 comprising a wetting agent selected from the group consisting of a silane, a fluorocarbon, and an acrylate resin, wherein the wetting agent is at a concentration that is between about 0.005 and about 2.0 weight percent of the underfill solution.

13. The underfill solution of claim 2 comprising a defoaming agent comprising a polyether modified siloxane, a methylalkyl siloxane, or a combination thereof, wherein the defoaming agent is at a concentration that is no more than about 1 weight percent of the underfill solution.

14. The underfill solution of claim 2 comprising a silane coupling agent comprising organomodified silicone molecules, wherein the silane coupling agent is at a concentration that is between about 0.05 to about 2 weight percent of the underfill solution.

15. The underfill solution of claim 2 comprising a toughening agent, the toughening agent comprising submicron particles of a silicone resin selected from the group consisting of a silicon resin, an acrylic based core shell rubber, and a carboxyl terminated butadiene resin, wherein the toughening agent is at a concentration that is between about 0.5 and about 30 weight percent of the underfill solution.

16. The underfill solution of claim 2 comprising a leveling agent selected from the group consisting of a fluorosurfactant, an organomodified silicon, and an acrylic, wherein the leveling agent is at a concentration that is between about 0.01 and about 1.2 weight percent of the underfill solution.

17. The underfill solution of claim 2 comprising a OTE modifier selected from the group consisting of beryllium oxide, aluminum oxide, aluminum nitride, silicon carbide, silicon dioxide, a low expansion ceramic powder, and a low expansion glass powder, wherein the CTE modifier is at a concentration that is between about 10 and about 90 weight percent of the underfill solution.

18. The underfill solution of claim 2 wherein the epoxy resin component comprises a diglycidyl ether of bisphenol F at a concentration that is between about 50 and about 70 weight percent, a triglycidyl ether of triphenomethane at a concentration that is between about 5 and about 10 weight percent, and a polyglycidyl ether cresol novolac at a concentration that is between about 2 and about 8 weight percent, the salt is at a concentration that is between about 5 and about 20 weight percent, and wherein the underfill solution comprises a leveling agent at a concentration that is between about 0.1 and about 1 weight percent, a wetting agent at a concentration that is between about 0.1 and about 1 weight percent, a toughening agent at a concentration that is between about 5 and about 10 weight percent, and a silane coupling agent at a concentration that is between about 0.1 and about 1 weight percent.

19. The underfill solution of claim 2 being substantially free of an anhydride.

20. A method for attaching an integrated circuit device having at least one solder bump on a surface thereof to a circuit board having at least one metal pad on a surface thereof by soldering, the method comprising:

applying an underfill solution to the surface of the circuit board such that the underfill solution is in contact with the at least one metal pad, wherein the underfill solution comprises an epoxy resin component and a fluxing curative for curing the epoxy resin component and for fluxing the at least one solder bump, the fluxing curative comprising a salt that is a reaction product of an imidazole component and a carboxylic acid component having at least 10 carbon atoms per molecule;

placing the integrated circuit device onto the circuit board to yield a circuit board with the integrated circuit device placed thereon; and heating the circuit board with the integrated circuit device placed thereon to a reflow temperature to melt and flux the at least one solder bump, to flow the underfill, and to cure the epoxy resin thereby yielding a circuit board having the integrated circuit device attached thereto with a solder connection and a cured underfill.

21. The method of claim 20 wherein the reflow temperature is less than about 300° C.

22. The method of claim 20 wherein the reflow temperature is between about 220° C. and about 260° C.

23. The method of claim 20 wherein the reflow temperature is between about 170° C. and about 225° C.

24. The method of claim 20 wherein the solder is selected from the group consisting of lead-containing solder alloys and lead-free solder alloys.

25. The method of claim 20 wherein the underfill solution is substantially free of an anhydride.

* * * * *

UNITED STATES PATENT AND TRADEMARK OFFICE
CERTIFICATE OF CORRECTION

PATENT NO.        : 7,213,739 B2                                                           Page 1 of 1
APPLICATION NO. : 10/817138
DATED             : May 8, 2007
INVENTOR(S)       : Wilson et al.

It is certified that error appears in the above-identified patent and that said Letters Patent is hereby corrected as shown below:

Column 20, claim 17, line 57: "OTE" should read -- CTE --.

Signed and Sealed this

Seventh Day of August, 2007

JON W. DUDAS
*Director of the United States Patent and Trademark Office*